United States Patent
Kageyama et al.

(10) Patent No.: US 7,881,353 B2
(45) Date of Patent: Feb. 1, 2011

(54) SURFACE EMITTING LASER ELEMENT ARRAY

(75) Inventors: Takeo Kageyama, Tokyo (JP); Keishi Takaki, Tokyo (JP); Naoki Tsukiji, Tokyo (JP); Norihiro Iwai, Tokyo (JP); Hitoshzi Shimizu, Tokyo (JP); Yasumasa Kawakita, Tokyo (JP); Suguru Imai, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 44 days.

(21) Appl. No.: 12/414,610

(22) Filed: Mar. 30, 2009

(65) Prior Publication Data

US 2009/0245312 A1    Oct. 1, 2009

(30) Foreign Application Priority Data

Mar. 31, 2008    (JP)    ............................ 2008-094026

(51) Int. Cl.
 *H01S 5/00* (2006.01)
(52) U.S. Cl. .............. 372/46.01; 372/43.01; 372/45.01; 372/50.12; 372/50.124
(58) Field of Classification Search .............. 372/45.01, 372/46.01, 50.12, 50.124
See application file for complete search history.

(56) References Cited

U.S. PATENT DOCUMENTS

| 7,061,956 | B2 | 6/2006 | Eitel | |
|---|---|---|---|---|
| 2002/0094004 | A1* | 7/2002 | Furukawa | ..................... 372/46 |
| 2006/0285567 | A1* | 12/2006 | Otoma | ..................... 372/50.1 |

FOREIGN PATENT DOCUMENTS

JP    11261174    9/1999

\* cited by examiner

*Primary Examiner*—Dung T Nguyen
(74) *Attorney, Agent, or Firm*—Turocy & Watson, LLP

(57) ABSTRACT

Provided is a surface emitting laser element array of low cost and high reliability. The surface emitting laser element array has a substrate having a semiconductor of a first conduction type; and a plurality of surface emitting laser elements each having, above the substrate, an active layer sandwiched between a first conduction type semiconductor layer area and a second conduction type semiconductor layer area and disposed between a upper reflective mirror and a lower reflective mirror, the surface emitting laser elements being separated from each other by an electric separation structure formed having such a depth as to reach the substrate. The first conduction type semiconductor layer area is arranged between the substrate and the active layer. The surface emitting laser element array further has a current blocking layer arranged between the substrate and the first conduction type semiconductor layer area; and two electrodes connected to the first conduction type semiconductor layer area and the second conduction type semiconductor layer area, respectively, and arranged on a side of the current blocking layer opposite to the substrate.

12 Claims, 6 Drawing Sheets

SURFACE EMITTING LASER ELEMENT ARRAY

CROSS-REFERENCE TO RELATED APPLICATIONS

This application claims priority to Japanese patent application No. 2008-094026, filed on Mar. 31, 2008, the entire content of which is incorporated herein by reference.

TECHNICAL FIELD

The present invention relates to surface emitting laser element array having a plurality of surface emitting laser elements on a substrate.

BACKGROUND ART

Due to explosive increase in communication capacity, attention is given to arrayed elements arranged spatially in parallel, and particularly to a surface emitting laser element array having elements that are easy to array. As the surface emitting laser elements, those having a threshold current of about sub mA are brought into practical use for realization of high-reflective multilayer reflector (DBR: distributed Bragg reflector) or development of a current confinement structure by ion implantation or selective oxidation. Also with development of material for each wavelength, surface emitting lasers for light of various wavelengths are in practical use. Meanwhile, as to speedup, reduction in parasitic capacitance, reduction in electric resistance, increase in differential gain due to optimization of active layer materials, structure and property and low threshold values enable realization of high-speed elements exceeding 10 Gbps.

Meanwhile, when the surface emitting laser elements are arrayed to perform parallel transmission, there occur a problem of various cross talks between the elements, and particularly, of electrical cross talks. To solve this problem, the technique for preventing electrical cross talks is disclosed (for example, in the patent documents 1 and 2).

According to the above-mentioned patent documents 1 and 2, electrical isolation between the elements is maintained by using a semi-insulating substrate and separation grooves for isolation formed by etching or doping a buffer layer with chromic oxide or the like by the same method as the method for manufacturing the semi-insulating substrate.

[Patent Document 1] U.S. Pat. No. 7,061,956, specification.

[Patent Document 2] Japanese Patent Application Laid-open No. 11-261174.

DISCLOSURE OF THE INVENTION

Problems to be Solved by Invention

However, the surface emitting laser elements of conventional structure has such a problem that as the surface emitting laser elements are increased in number (hereinafter referred to as "number of channels"), their reliability becomes reduced and performance is more degraded than designed, which results in decrease of manufacturing yield and increase in cost.

The present invention was made in view of the foregoing, and has an object to provide a surface emitting laser element array of low cost and high reliability.

Means for Solving Problem

In order to solve the above-mentioned problem and fulfill the object, a surface emitting laser element array according to one aspect of the present invention is a surface emitting laser element array comprising: a substrate having a semiconductor of a first conduction type; a plurality of surface emitting laser elements each having, above the substrate, an active layer sandwiched between a first conduction type semiconductor layer area and a second conduction type semiconductor layer area and disposed between a upper reflective mirror and a lower reflective mirror, the surface emitting laser elements being separated from each other by an electric separation structure formed having such a depth as to reach the substrate; the first conduction type semiconductor layer area being arranged between the substrate and the active layer; a current blocking layer arranged between the substrate and the first conduction type semiconductor layer area; and two electrodes connected to the first conduction type semiconductor layer area and the second conduction type semiconductor layer area, respectively, and arranged on a side of the current blocking layer opposite to the substrate.

The surface emitting laser element array according to another aspect of the present invention is characterized in that, in the above-described invention, the current blocking layer has a second conduction type.

The surface emitting laser element array according to yet another aspect of the present invention is characterized in that, in the above-described invention, the current blocking layer has a layer thickness of 50 nm or more and a second conduction type carrier concentration is $5 \times 10^{17}$ cm$^{-3}$ or more.

The surface emitting laser element array according to yet another aspect of the present invention is characterized in that, in the above-described invention, the current blocking layer is of high resistance.

The surface emitting laser element array according to yet another aspect of the present invention is characterized in that, in the above-described invention, the current blocking layer is a compound semiconductor layer containing arsenic as a main v-group element and doped with at least one of nitrogen, carbon, oxygen, boron and chromic oxide at a concentration of $1 \times 10^{16}$ cm$^{-3}$ or more.

The surface emitting laser element array according to yet another aspect of the present invention is characterized in that, in the above-described invention, the current blocking layer is a compound semiconductor layer containing phosphorus as a main v-group element and doped with iron at a concentration of $1 \times 10^{16}$ cm$^{-3}$ or more.

The surface emitting laser element array according to yet another aspect of the present invention is a surface emitting laser element array comprising: a substrate having a semiconductor of a first conduction type; a plurality of surface emitting laser elements each having, above the substrate, an active layer sandwiched between a first conduction type semiconductor layer area and a second conduction type semiconductor layer area and disposed between a upper reflective mirror and a lower reflective mirror, the surface emitting laser elements being separated from each other by an electric separation structure formed having such a depth as to reach the substrate; the second conduction type semiconductor layer area being arranged between the substrate and the active layer; and two electrodes connected to the first conduction type semiconductor layer area and the second conduction type semiconductor layer area, respectively, and arranged on a side of the second conduction type semiconductor layer area opposite to the substrate.

The surface emitting laser element array according to yet another aspect of the present invention is characterized in that, in the above-described invention, an electric resistance between electrodes of adjacent surface emitting laser elements becomes at least 100 times larger than an electric resistance of each of the surface emitting laser elements.

Figure 1:
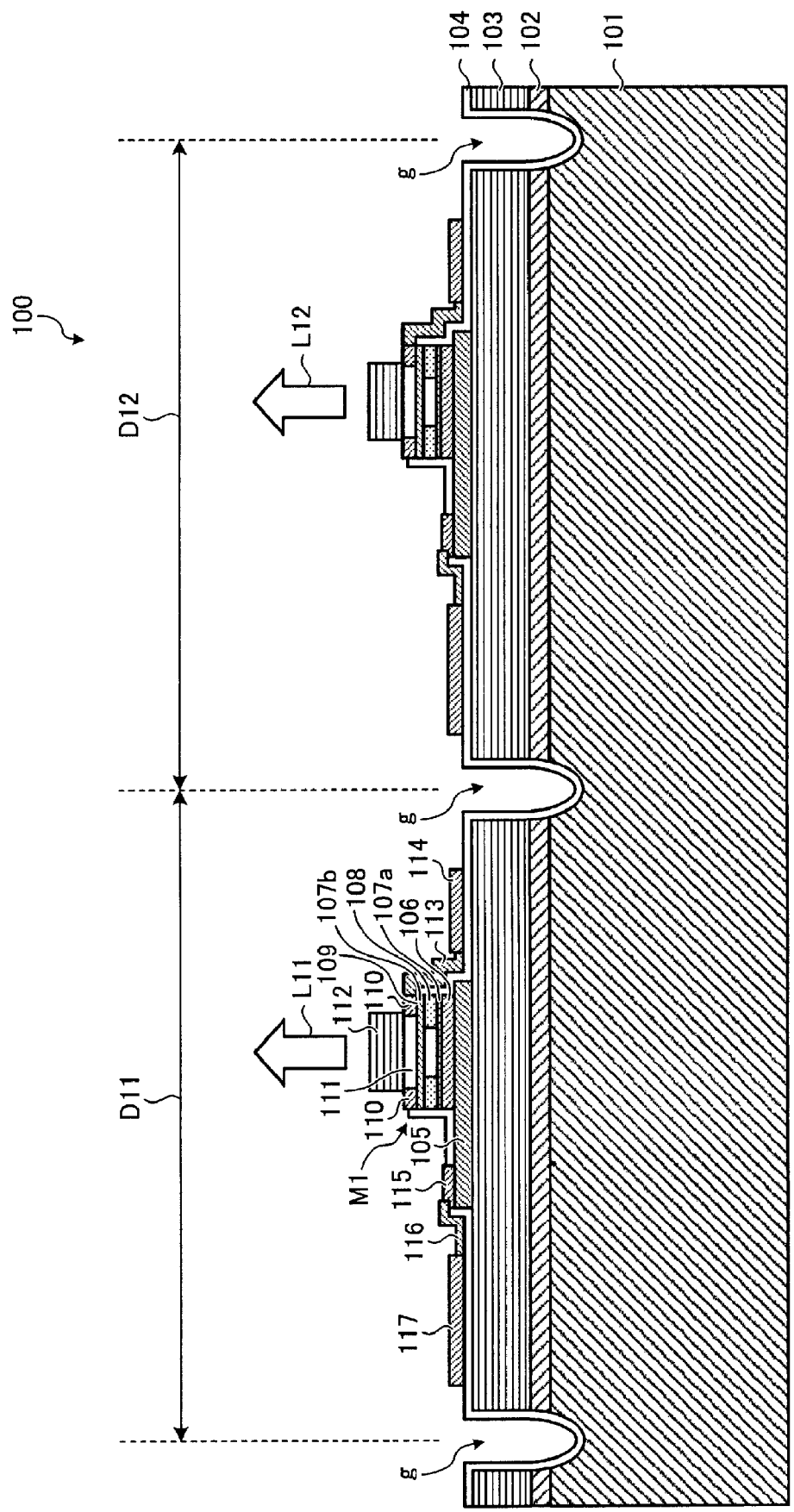
FIG. 1 is a cross sectional view schematically illustrating a surface emitting laser element array according to the embodiment 1.

EXPLANATION OF REFERENCE NUMERALS 100 to 400 surface emitting laser element array;
101 to 401 substrate;
102 to 402 p-type current blocking layer;
103 to 403 lower DBR mirror;
104 to 404 insulating film;
105 to 405, 419 n-type contact layer;
106, 406 active layer;
107a p-type lower spacer layer;
107b p-type upper spacer layer;
108 to 308 current confinement layer;
109 to 309 p-type contact layer;
110 to 410 p-type electrode;
111 to 411 dielectric film;
112 to 412 upper DBR mirror;
113 to 413, 116 to 416 lead;
114 to 414 p-side pad electrode;
115 to 415 n-side electrode;
117 to 418 n-side pad electrode;
206, 306 λ resonator layer;
407 p-type spacer layer;
418 tunnel junction layer;
D11 to D41, D12 to D42 surface emitting laser element;
g separation groove;
L11 to L41, L12 to L42 laser light;
M1, M21, M3, M4 mesa post structure;
M22, M23 mesa structure.

EFFECT OF INVENTION

According to the present invention, it becomes possible to prevent decrease in manufacturing yield and reliability due to threading dislocation of the substrate while maintaining electric isolation. This makes it possible to realize a surface emitting laser element array of low cost and high reliability.

Preferred Embodiment for Carrying Out the Invention

With reference to the drawings, the surface emitting laser element array according to embodiments of the present invention will be described in detail below. However, these embodiments are not for limiting the present invention. In the embodiments, a first conduction type is an n type and a second conduction type is a p type. And, "X" means a multiplication operator.

Embodiment 1

First description is made about a surface emitting laser element array according to the embodiment 1 of the present invention. The surface emitting laser element array according to the embodiment 1 is made of a GaAs semiconductor having a laser oscillation frequency of 1300 nm and 100 channels.

FIG. 1 is a cross sectional view schematically showing a surface emitting laser element array 100 according to the embodiment 1. The surface emitting laser element array 100 has 100 surface emitting laser elements arranged on the substrate 101 in Cartesian grid form of 10 width×10 length. FIG. 1 shows adjacent surface emitting laser elements D1 and D12 only. The surface emitting laser elements of the surface emitting laser element array 100 have the same structures, and therefore, description is only made of the surface emitting laser element D11. The surface emitting laser element D11 has a p-type current broking layer 102, a lower DBR mirror 103 which is a distributed Bragg reflector (DBR), an n-type contact layer 105, an active layer 106, a p-type lower spacer layer 107a, a current confinement layer 108, a p-type upper spacer layer 107b and a p-type contact layer 109 stacked on the substrate 101 of n-type GaAs, sequentially. Here, the active layer 106 through the p-type contact layer 109 are structured to have a column-shaped mesa post structure M1. Further, from the surface of the lower DBR mirror 103 to the substrate 101, a separation groove g is formed as a separation structure for separating each surface emitting laser element electrically. Besides, on the p-type contact layer 109, a ring-shaped p-side electrode 110 is formed. On the surface except the surface of the p-side electrode 110, an insulating film 104 is formed and inside the ring of the p-side electrode 110, a dielectric film 111 is formed. On the dielectric film 111, an upper DBR mirror 112 is formed. Further, a p-side pad electrode 114 is formed on the insulating film 104 and is connected to the p-side electrode 110 via a lead 113 extending onto the insulating film 104. On the n-type contact layer 105, a semi-circular n-side electrode 115 is formed surrounding the mesa post structure M1. Furthermore, an n-side pad electrode 117 is formed on the insulating film 104 and is connected to the n-side electrode 115 via a lead 116 extending onto the insulating film 104.

The substrate 101 is made of an n-type GaAs doped with an n-type dopant such as silicon (Si) at a concentration of $5 \times 10^{17}$ to $5 \times 10^{18}$ cm$^{-3}$. On the surface thereof, there is formed as a buffer layer, an n-type GaAs layer doped with an n-type dopant at a concentration of $1 \times 10^{18}$ cm$^{-3}$. The p-type current blocking layer 102 is a DBR mirror having two stacked structures of AlAs/GaAs doped with a p-type dopant of carbon (C) or the like at a concentration of $1 \times 10^{18}$ cm$^{-3}$. The lower DBR mirror 103 has 30 stacked structures of non-doped AlAs/GaAs. The p-type current blocking layer 102 and the lower DBR mirror 103 form a DBR mirror of which the reflective center wavelength is 1300 nm. When the wavelength λ is 1300 nm, the thickness of each of layer of the p-type current blocking layer 102 and the lower DBR mirror 103 is set to be an optical length of λ/4. Here, the optical length means the layer thickness multiplied by the refractive index. Besides, the n-type contact layer 105 is made of an n-type GaAs doped with an n-type dopant at a concentration of $1\times10^{18}$ cm$^{-3}$.

Further, the active layer 106 has a three-layer Quantum well structure made of GaInNAs/GaAs. The p-type lower spacer layer 107a and the p-type upper spacer layer 107b are made of p-type GaAs doped with a p-type dopant at a concentration of $1\times10^{18}$ cm$^{-3}$. The current confinement layer 108 has an insulating current confinement part made of $Al_2O_3$ and a circular-disc-shaped current injection part positioned in the center of the mesa post structure M1. This current confinement layer 108 is formed by the well-known selective oxidation. Besides, the p-type contact layer 109 is made of p-type GaAs doped with a p-type dopant at a high concentration of $1\times10^{19}$ cm$^{-3}$. The p-side electrode 110 has a Ti/Au structure. The insulating film 104 and the dielectric film 111 are both of $SiO_2$. The upper DBR mirror 112 is a dielectric multilayer film reflective mirror and when λ is 1300 nm, the upper DBR mirror 112 has a six stacked structures of $Si/SiO_2$ (the layer thickness is an optical length of λ/4). The n-side electrode 115 is made of AuGe/Ni/Au. The p-side pad electrode 114, the n-side pad electrode 117 and the leads 113 and 116 all have structures of Cu/Au.

This surface emitting laser element D11 has a double intra cavity contact structure in which the p-side electrode and n-side electrode 115 are interposed between the lower DBR mirror 103 and the upper DBR mirror 112. Then, when voltage is applied to the p-side electrode 110 and the n-side electrode 115 via the p-side pad electrode 114 and the n-side pad electrode 117 and current is injected from the p-side electrode 110, current of which the current density is increased by the current confinement layer 108 is injected to the active layer 106 thereby to cause light emission from the active layer 106. This light emission is used as a basis to output laser light L11 having a wavelength of 1300 nm by the optical resonator structure of the lower DBR mirror 103 and the upper DBR mirror 112. Likewise, the surface emitting laser element D12 outputs laser light L12 having a wavelength of 1300 nm by current injection.

Here, the substrate 101 is a substrate manufactured by the VGF (Vertical Gradient Freeze) method and doped with the n-type dopant at the concentration of $5\times10^{17}$ to $5\times10^{18}$ cm$^{-3}$. Its etch pit density (EPD) is low, specifically, 500 cm$^{-2}$ or less. Here, the EPD is a density of pits generated corresponding to threading dislocation when the substrate surface is etched. As the substrate 101 has a low threading dislocation density of 500 cm$^{-2}$ or less which causes EPD, the threading dislocation density of each semiconductor layer epitaxially grown on the substrate 101 also becomes low. Hence, in this surface emitting laser element D11, the element deterioration and deviation from the design of the element characteristics are reduced.

In other words, when the threading dislocation crosses the active layer, crystal defects which are energized by carrier recombination repeat upward and downward dislocation motion and the dislocation network extends all over the active layer, which finally results in deterioration of elements. Besides, like this surface emitting laser element D11, when the current confinement layer is formed by selective oxidation, if the threading dislocation exists in the mesa post structure, this may cause delayed deterioration (growth of dislocation network is slower than that of the light emitting part) or deformation of the current injection part during the selective oxidation step so that it becomes difficult to manufacture the element as designed. That is, if there exist etch pits in a substrate part under an area where the mesa post structure of the surface emitting laser element is formed, this causes deterioration of the element or deviation from the design of the element characteristics, which results in reduction of reliability and yield.

On the other hand, in this surface emitting laser element D11, as the EPD of the substrate 101 is low, that is, 500 cm$^{-2}$ or less, it is possible to prevent element deterioration and deviation from the design of the element characteristics and the surface emitting laser element becomes a surface emitting laser element of low cost and high reliability. Here, such an n-type GaAs substrate of EPD of 500 cm$^{-2}$ or less is easily available at low cost.

Further, this surface emitting laser element D11 has the p-type current blocking layer 102 between the substrate 101 and the active layer 106, and the adjacent surface emitting laser elements are separated from each other by the separation groove g. Hence, electric isolation can be maintained even if the n-type conducting substrate 101.

In other words, in the conventional surface emitting laser element array, in order to prevent electrical cross talks between elements, a semi-insulating substrate has been used. However, the inventors of this invention has examined by which reliability reduction and deviation from the design are caused in the surface emitting laser element array of conventional structure and found that these are caused by the high threading dislocation density or EPD of the semi-insulating substrate.

For the semiconductor substrate, if it is doped with a small amount of appropriate element, the EPD becomes low, while the non-doped semi-insulating substrate has high EPD. For example, the EPD or the threading dislocation density of the non-doped semi-insulating GaAs substrate crystal-grown by the LEC method is about 50000 cm$^{-2}$. Meanwhile, the inventors have studied intently so as to prevent reduction in reliability and deviation from the design and conceived the present invention.

Next description is made about electric isolation between elements. As all surface emitting laser elements of the surface emitting laser element array have almost the same characteristics, almost the same voltage between adjacent elements is applied by driver ICs corresponding to respective elements. When current flows into adjacent elements, this is caused by applying a originally-applied level of voltage or less voltage to between the elements. Hence, when the electric resistance of a signal surface emitting laser element is R2 and if the electric cross talk is −20 dB or less, the resistance between elements needs to be 100×R2 or more. When the electric cross talk is −30 dB or less, the resistance between elements needs to be 1000×R2 or more. Here, the resistance between elements R1 is expressed with the element resistance R2, the resistance R3 between the lowermost part of the DBR mirror and the substrate and the resistance R4 of the substrate as R1=R2+2R3+R4. If R1>>R2 and R1>>R4, R1 to 2R3 may be used. If the resistance between elements is an electric resistance between n-type contact layers of adjacent surface emitting laser elements, the resistance between elements needs to be at least 40 Ω×100=4 MΩ for 850 MM, 100 Ω×100=10 MΩ for 1300 SM, and preferably, 40 MΩ or more for 850 MM, and 50 MΩ for 1300 nmSM.

Figure 2:
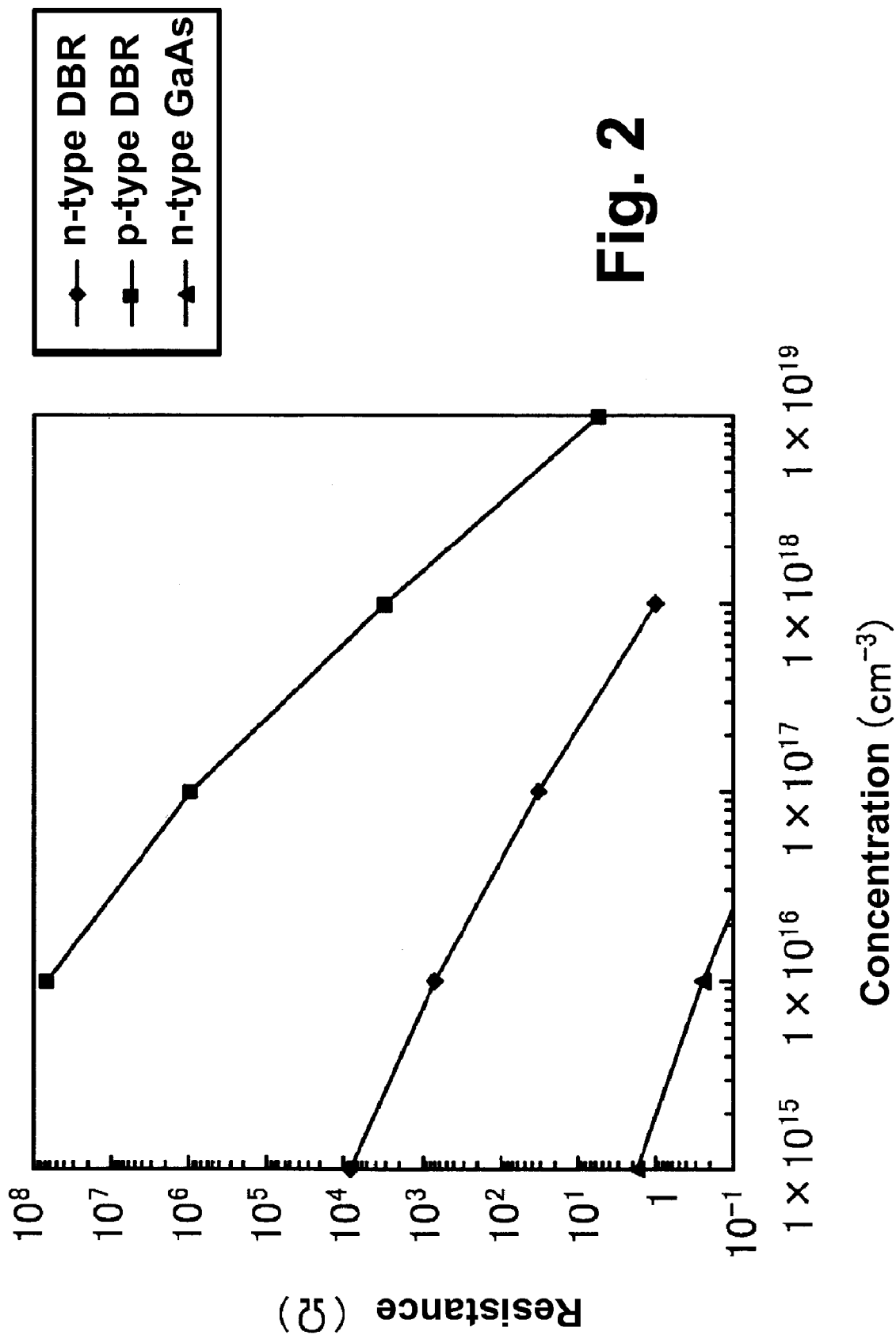
FIG. 2 is a graph showing the relationship between dopant concentration and electric resistance.
Figure 3:
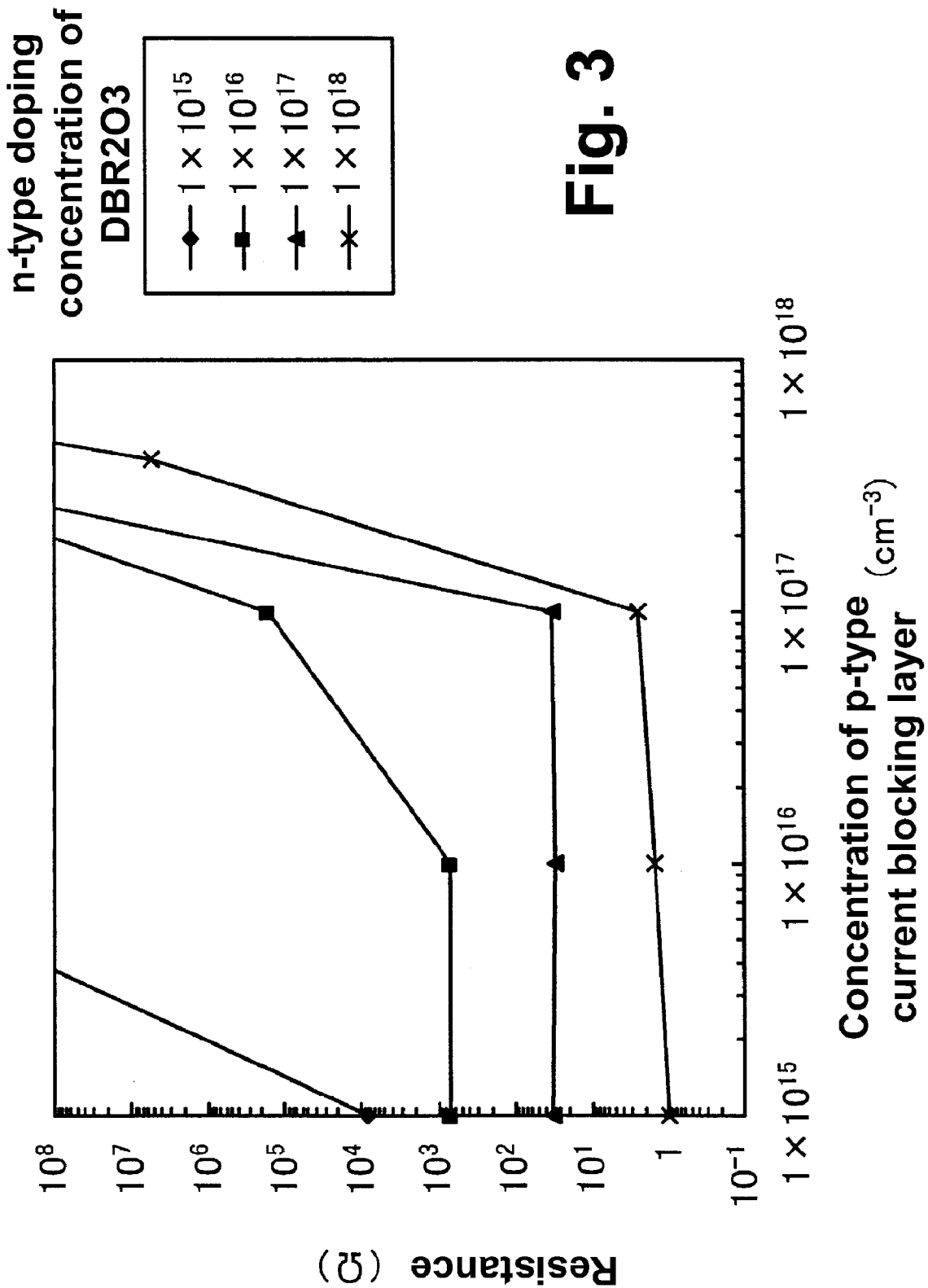
FIG. 3 is a graph showing the relationship between DBR mirror concentration of the p-type current blocking layer and electric resistance.

FIG. 2 is a view showing the relation between dopant concentration and electric resistance when positioned between the electric resistance between the n-type substrate 101 and the n-type contact layer 105 is a DBR (wavelength of 1300 nm) having 30 pairs of AlAs/GaAs doped uniquely with n-type dopant, when positioned between the electric resistance between the n-type substrate 101 and the n-type contact layer 105 is a DBR (wavelength of 1300 nm) having 30 pairs of AlAs/GaAs doped uniquely with p-type dopant and when positioned between the electric resistance between the n-type substrate 101 and the n-type contact layer 105 is a GaAs layer doped uniquely with n-type dopant and having a total thickness of 6 μm (total thickness of the DBR having 30 pairs of AlAs/GaAs) (with no current blocking layer). In FIG. 2, when the DBR is doped uniquely with n-type dopant, the enough isolation resistance cannot be maintained even by lowering the doping concentration up to about $1\times10^{15}$ cm$^{-3}$. As there is difficulty in controlling the low doping concentration of about $1\times10^{17}$ cm$^{-3}$ accurately during epitaxial growth. Likewise, the p-type case is not favorable as it is necessary to lower the doping concentration up to about $1\times10^{15}$ cm$^{-3}$. On the other hand, FIG. 3 is a graph showing the relation between concentrations of the DBR mirror of the p-type current blocking layer and the electric resistances for four cases of n-type lower DBR mirror ranging from $1\times10^{15}$ cm$^{-3}$ to $1\times10^{18}$ cm$^{-3}$. As shown in FIGS. 2 and 3, when the carrier concentration of the p-type current blocking layer is $5\times10^{17}$ cm$^{-3}$ or more, enough resistance R3 can be obtained. As to the layer thickness of the p-type current blocking layer, it is preferably 50 nm or more.

Here, the surface emitting laser element array 100 shown in FIG. 1 is manufactured as follows: First, the buffer layer is formed on the substrate 101 by the MBE method. Then, the MOCVD method or the like is used to form the p-type current blocking layer 102, the lower DBR mirror 103, the n-type contact layer 105, the active layer 106, the p-type lower spacer layer 107a, the AlAs layer for the current confinement layer 108, the p-type upper spacer layer 107b and the p-type contact layer 109 sequentially. Their epitaxial growth may adopt the MOCVD method. Further, on the p-type contact layer, photolithography is used to form a resist pattern for the electrode pattern, and vacuum deposition is performed to form a metal film of Ti/Au structure. Then, liftoff method is used to form the ring-shaped p-side electrode 110. This is followed by protecting an inside opening of the p-side electrode 110 with a hard bake resist, performing dry etching to such a depth that the n-type contact layer 105 is exposed and forming the mesa post structure M1. Then, the substrate temperature is set to 450 degrees and the AlAs layer is selective-oxidized in water vapor atmosphere thereby to form the current confinement layer 108. Then, the plasma CVD method is used to form the insulating film 104 to cover the whole surface with SiN film. The photolithography is used to form an n-side electrode pattern. $CF_4$ gas is used etching to remove the insulating film 104 on the n-type contact layer so that the n-type contact layer 105 is exposed. Next, on the exposed n-type contact layer 105, the n-side electrode 115 is formed by the same process as that of the p-side electrode 110. Then, the electron beam evaporation method is used to evaporate given pairs of Si/SiO$_2$ structure before the lift off method is used to for the upper DBR mirror 112. Further, by the same process as the p-type electrode 110, the p-side pad electrode 114, the n-side pad electrode 117, the leads 113 and 116 are formed. Finally, the wet etching is performed to form the separation groove g having a depth extending from the surface of the lower DBR mirror 103 to the substrate 101, and thereby the surface emitting laser element array 100 is completed.

Here, in the lower DBR mirror 103 used in the present embodiment 1 is a non-doped type. However, it may be of an n type doped with Si. If the lower DBR mirror 103 is of n type, electric isolation can be maintained by the p-type current blocking layer 102.

Next, the above-mentioned manufacturing method is used to manufacture 100-channel surface emitting laser elements of the embodiment 1. Used as the substrate is an n-type GaAs substrate manufactured by the VGF method. Measured EPD of this GaAs substrate is 250 cm$^{-2}$. Besides, the mesa diameter of each surface emitting laser element is 30 μm and the element interval is 250 μm in both length and width.

The characteristics of each surface emitting laser element are measured with a result that electric resistance of each surface emitting laser element is 80Ω when a voltage of 2.5 V is applied. Besides, as the electric resistance between adjacent elements needs to be at least 100 times, or 8 kΩ, larger than the element resistance, the electric resistance between the adjacent elements measured between the n-side electrodes is 100 MΩ or more enough to meet the requirement. Further, the adjacent elements are driven separately with modulation signals of 10 Gbps at a modulation speed of 10 Gbps and eye pattern of laser light output from one of the elements is measured. Measurement result shows the eye pattern is the same as that of the single driving case and no electric cross talk is recognized.

Embodiment 2

Next description is made about a surface emitting laser element array according to the embodiment 2 of the present invention. The surface emitting laser element array according to the embodiment 2 is made of a GaAs semiconductor having a laser oscillation frequency of 850 nm and 100 channels.

Figure 4:
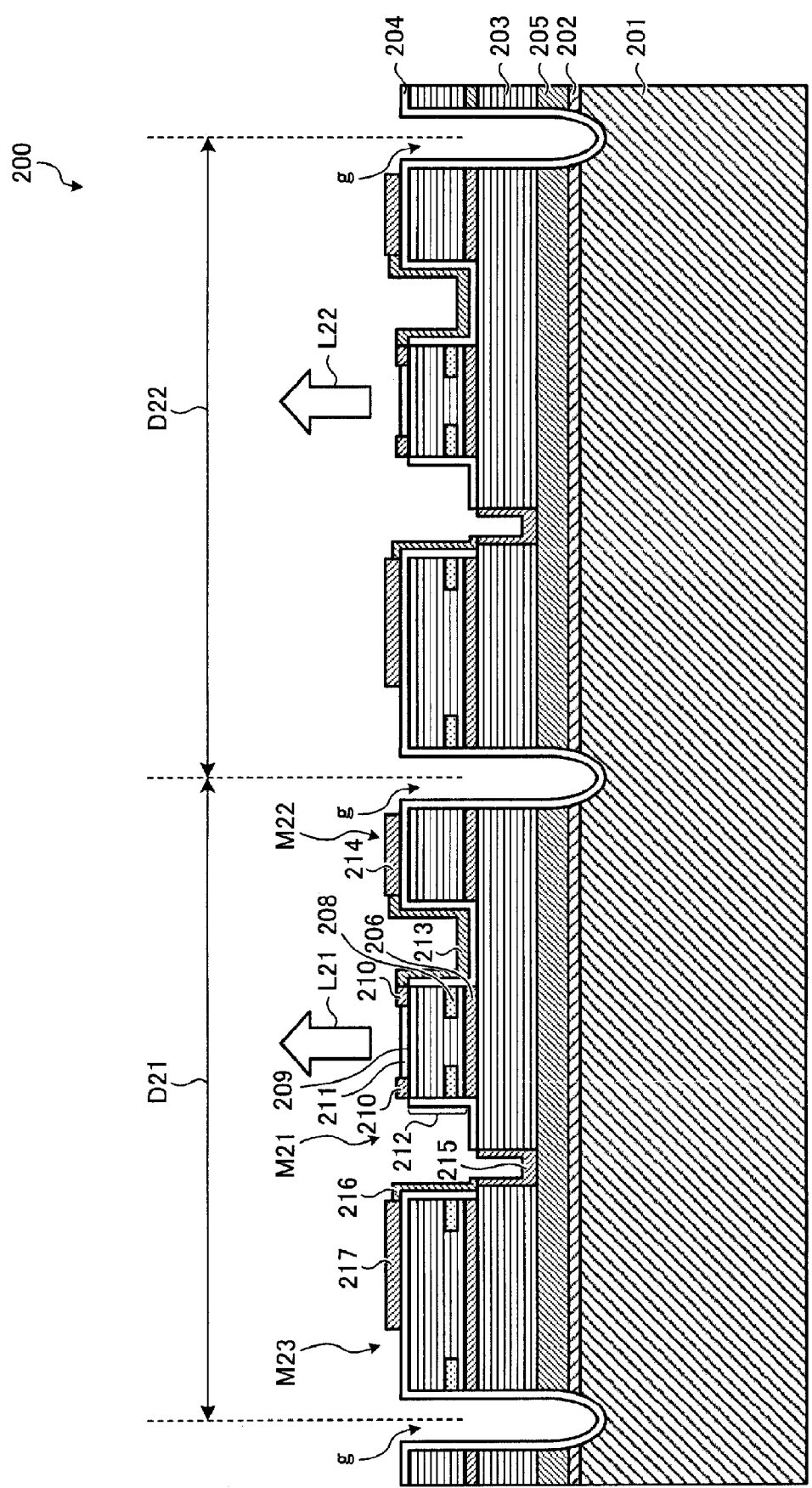
FIG. 4 is a cross sectional view schematically illustrating a surface emitting laser element array according to the embodiment 2.

FIG. 4 is a cross sectional view schematically showing a surface emitting laser element array 200 according to the embodiment 2. The surface emitting laser element array 200 has 100 surface emitting laser elements arranged on the substrate 201 in 10 width×10 length. FIG. 4 shows adjacent surface emitting laser elements D21 and D22 only. The surface emitting laser elements of the surface emitting laser element array 200 have the same structures, and therefore, description is only made of the surface emitting laser element D21. The surface emitting laser element D21 has a p-type current broking layer 202, an n-type contact layer 205, a lower DBR mirror 203, a λ resonator layer 206, an upper DEB mirror 212 having a current confinement layer 208, and a p-type contact layer 209 stacked on the substrate 201 of n-type GaAs, sequentially. Here, the λ resonator layer 206 through the p-type contact layer 209 are structured to have a column-shaped mesa post structure M21. Further, at the periphery of the mesa post structure M21, mesa structures M22 and M23 are formed. The mesa post structure M21 and the mesa structure M22 are separated by a groove formed to reach the lower DBR mirror 203, and the mesa post structure M21 and the mesa structure M23 are separated by a groove formed to reach the n-type contact layer 205. From the surface of the upper DBR mirror 212 to the substrate 201, a separation groove g is formed as a separation structure for separating each surface emitting laser element electrically. Besides, on the p-type contact layer 209, a ring-shaped p-side electrode 210 is formed. On the surface except the surface of the p-side electrode 210, an insulating layer 204 is formed and inside the ring of the p-side electrode 210, a dielectric film 211 is formed. Further, a p-side pad electrode 214 is formed on the insulating layer 204 of the mesa structure M22 and is connected to the p-side electrode 210 via a lead 213 extending onto the insulating layer 204. On the n-type contact layer 205, an n-side electrode 215 is formed in contact therewith. Furthermore, an n-side pad electrode 217 is formed on the insulating layer 204 of the mesa structure M23 and is connected to the n-side electrode 215 via a lead 216 extending onto the insulating layer 204.

The substrate 201 is made of an n-type GaAs doped with an n-type dopant at a concentration of $5 \times 10^{17}$ to $5 \times 10^{18}$ cm$^{-3}$. On the surface thereof, there is formed as a buffer layer, an n-type GaAs layer doped with an n-type dopant at a concentration of $1 \times 10^{18}$ cm$^{-3}$. The p-type current blocking layer 202 is of p-type GaAs of 300 nm thickness doped with a p-type dopant of C or the like at a concentration of $1 \times 10^{18}$ cm$^{-3}$. The n-type contact layer 205 is of n-type GaAs of 1 μm thickness doped with an n-type dopant at a concentration of $1 \times 10^{18}$ cm$^{-3}$. The lower DBR mirror 203 has 35.5 stacked structures of n-AiAs/Ai$_{0.2}$Ga$_{0.8}$As doped with an n-type dopant at a concentration of $1 \times 10^{18}$ cm$^{-3}$. The reflective center wavelength of the lower DBR mirror 203 is 850 nm. When the wavelength λ is 850 nm, the thickness of each layer of the lower DBR mirror 203 is set to be an optical length of λ/4.

Further, the λ resonator layer 206 has staked layers of an n-Al$_{0.3}$Ga$_{0.7}$AS layer (Si doping concentration $5 \times 10^{17}$ cm$^{-3}$) as a cladding layer, an active layer having a three-layer quantum well structure made of a GaAs/Al$_{0.2}$Ga$_{0.8}$As structure and a p-Al$_{0.3}$Ga$_{0.7}$As layer as a cladding layer (doping concentration $5 \times 10^{17}$ cm$^{-3}$). The total thickness of the λ resonator layer 206 is an optical length of λ. The active layer is arranged to be in the center of the λ resonator layer 206. The upper DBR mirror 212 is formed by stacking two structures of p-AlAs/Al$_{0.2}$Ga$_{0.8}$As (thickness of each layer is an optical length of λ/4), a current confinement layer 208 and then 22.5 such structures. Here, the current confinement layer 208 has a thickness of 30 nm and has an insulating current confinement part of Al$_2$O$_3$ and a circular-disc-shaped current injection part of AlAs positioned in the center of the mesa post structure M21. The p-type contact layer 209 is made of p-type GaAs doped with a p-type dopant at a high concentration of $1 \times 10^{19}$ cm$^{-3}$. The p-side electrode 210 has a Ti/Au structure. The insulating layer 204 and the dielectric film 211 are both of SiO$_2$. The n-side electrode 215 is made of AuGe/Ni/Au. The p-side pad electrode 214, the n-side pad electrode 217 and the leads 213 and 216 all have structures of Cu/Au.

In this surface emitting laser element D21, when voltage is applied to the p-side electrode 210 and the n-side electrode 215 via the p-side pad electrode 214 and the n-side pad electrode 217 and current is injected from the p-side electrode 210, current of which the current density is increased by the current confinement layer 208 is injected to the active layer of the λ resonator layer 206 thereby to cause light emission from the active layer. This light emission is used as a basis to output laser light L21 having a wavelength of 850 nm by the optical resonator structure of the lower DBR mirror 203 and the upper DBR mirror 212. Likewise, the surface emitting laser element D22 outputs laser light L12 having a wavelength of 850 nm by current injection.

Here, the substrate 201 is a substrate manufactured by the VGF method and doped with the n-type dopant at the concentration of $5 \times 10^{17}$ to $5 \times 10^{18}$ cm$^{-3}$. Its EPD is low, specifically, 500 cm$^{-2}$ or less, and as is the case with the embodiment 1, it becomes possible to prevent element deterioration and deviation from the design of the element characteristics.

Further, this surface emitting laser element D21 has the p-type current blocking layer 202 between the substrate 201 and the active layer of the λ resonator layer 206, and the adjacent surface emitting laser elements are separated from each other by the separation groove g. Hence, as is the case with the surface emitting laser element array 100 of the embodiment 1, electric isolation is also maintained.

Here, the surface emitting laser element array 200 shown in FIG. 4 is manufactured as follows: First, the buffer layer is formed on the substrate 201 by the MBE method. Then, the MOCVD method or the like is used to form the p-type current blocking layer 202 through the p-type contact layer 209 sequentially. Further, as is the case with the embodiment 1, the p-side electrode 210 is formed. This is followed by protecting an inside opening of the p-side electrode 210 with a hard bake resist, performing dry etching up to such a depth that the active layer side surface is exposed and forming the mesa post structure M21 and the mesa structure M22. Then, the substrate temperature is set to 430 degrees and the AlAs layer is selective-oxidized in water vapor atmosphere thereby to form the current confinement layer 208. Then, a pattern for covering the above-formed mesa wholly and having an opening at a part of the dry etching bottom surface is formed with hard bake resist, and second dry etching is performed on the pattern opening part up to such a depth that the n-type contact layer 205 is exposed. Here, the mesa structure M23 is formed. Next, the n-side electrode 215 is formed on the etched bottom surface in the second dry etching by the same process as that of the p-side electrode 210. Then, by the same method as that in the embodiment 1, the p-side pad electrode 214, the n-side pad electrode 217, the leads 213 and 216 are formed. Finally, the wet etching is performed to form the separation groove g having a depth extending from the surface of the upper DBR mirror 212 to the substrate 201, and thereby the surface emitting laser element array 200 is completed.

Next, the above-mentioned manufacturing method is used to manufacture 100-channel surface emitting laser elements of the embodiment 2. Used as the substrate is an n-type GaAs substrate manufactured by the VGF method. Measured EPD of this GaAs substrate is 250 cm$^{-2}$. Besides, the mesa diameter of each surface emitting laser element is 30 μm and the element interval is 250 μm in both length and width.

The characteristics of each surface emitting laser element are measured with a result that electric resistance of each surface emitting laser element is 40Ω when a voltage of 2.8 V is applied. Besides, as the electric resistance between adjacent elements needs to be 4 kΩ or more, the electric resistance between the adjacent elements measured between the n-side electrodes is 100 MΩ or more which is enough to meet the requirement. Further, the adjacent elements are driven separately with convoluted modulation signals of 10 Gbps and eye pattern of laser light output from one of the elements is measured. Measurement result shows the eye pattern is the same as that of the single driving case and no electric cross talk is recognized.

Embodiment 3

Next description is made about a surface emitting laser element array according to the embodiment 3 of the present invention. The surface emitting laser element array according to the embodiment 3 is different from that of the embodiment 2 in arrangement of the n-type contact layer.

Figure 5:
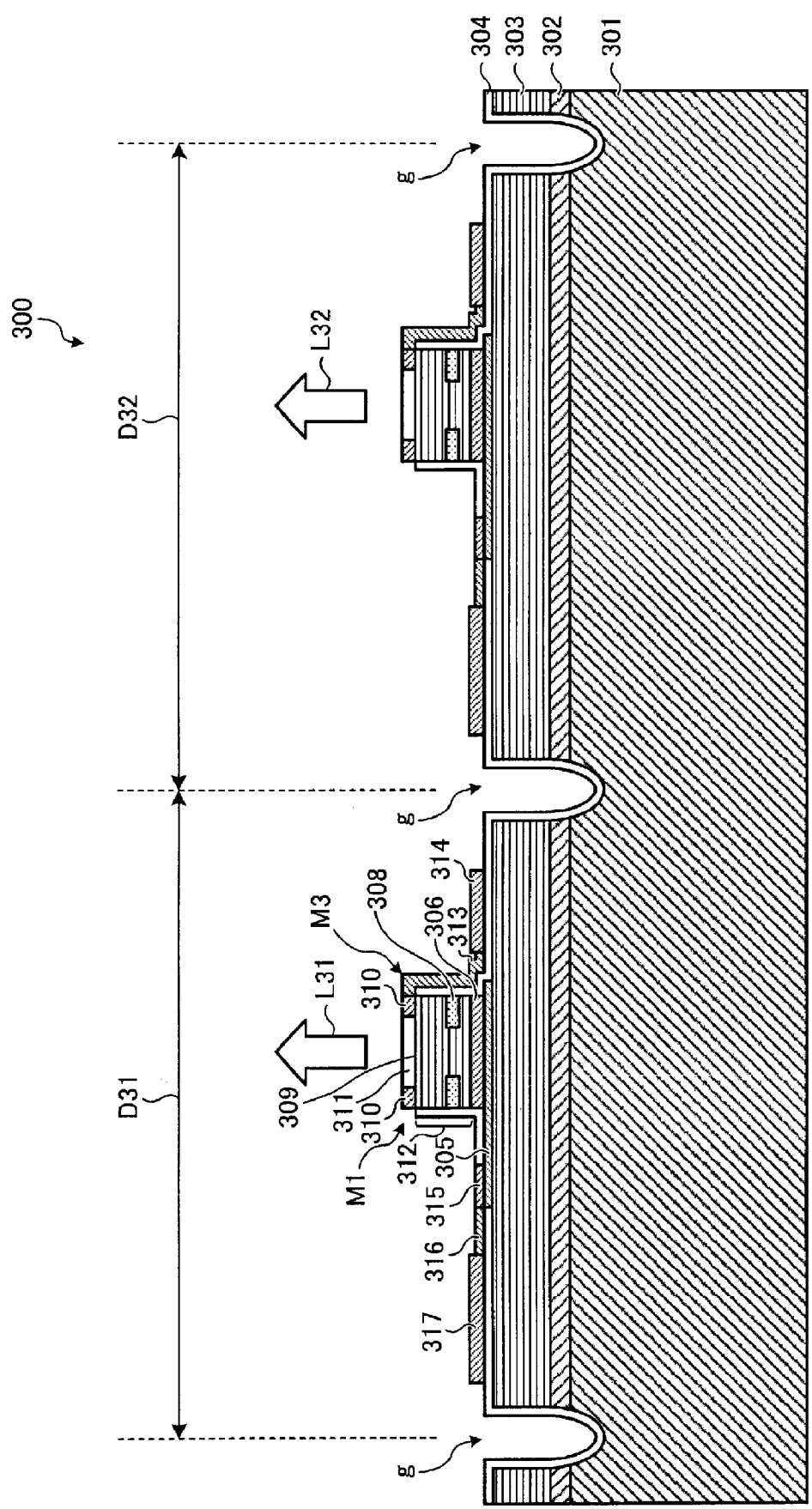
FIG. 5 is a cross sectional view schematically illustrating a surface emitting laser element array according to the embodiment 3.

FIG. 5 is a cross sectional view schematically showing a surface emitting laser element array 300 according to the embodiment 3. The surface emitting laser element array 300 has 100 surface emitting laser elements arranged on the substrate 301 in 10 width×10 length. FIG. 5 shows adjacent surface emitting laser elements D31 and D32 only. The following description is only made of the surface emitting laser element D31. The surface emitting laser element D31 has a p-type current broking layer 302, a lower DBR mirror 303, an n-type contact layer 305, a λ resonator layer 306, an upper DEB mirror 312 having a current confinement layer 308, and a p-type contact layer 309 stacked on the substrate 301 of n-type GaAs sequentially. Here, the λ resonator layer 306 through the p-type contact layer 309 are structured to have a column-shaped mesa post structure M3. Extending from the surface of the lower DBR mirror 303 to the substrate 301, a separation groove g is formed as a separation structure for separating each surface emitting laser element electrically. Besides, on the p-type contact layer 309, a ring-shaped p-side electrode 310 is formed. On the surface except the surface of the p-side electrode 310, an insulating film 304 is formed and inside the ring of the p-side electrode 310, a dielectric film 311 is formed. Further, a p-side pad electrode 314 is formed on the insulating film 304 and is connected to the p-side electrode 310 via a lead 313 extending onto the insulating film 304. On the n-type contact layer 305, a semi-circular n-side electrode 315 is formed so as to cover the mesa post structure M3. Furthermore, an n-side pad electrode 317 is formed on the insulating film 304 and is connected to the n-side electrode 315 via a lead 316 extending onto the insulating layer 304.

The substrate 301 is made of an n-type GaAs doped with an n-type dopant at a concentration of $5 \times 10^{17}$ to $5 \times 10^{18}$ cm$^{-3}$. On the surface thereof, there is formed as a buffer layer, an n-type GaAs layer doped with an n-type dopant at a concentration of $1 \times 10^{18}$ cm$^{-3}$. The p-type current blocking layer 302 is of p-type GaAs of 300 nm thickness doped with a p-type dopant of C or the like at a concentration of $1 \times 10^{18}$ cm$^{-3}$. The lower DBR mirror 303 has 35.5-pair stacked structures of n-AlAs/Al$_{0.2}$Ga$_{0.8}$As doped with an n-type dopant at a concentration of $1 \times 10^{18}$ cm$^{-3}$. The reflective center wavelength of the lower DBR mirror 303 is 850 nm. When the wavelength λ is 850 nm, the thickness of each layer of the lower DBR mirror 303 is set to be an optical length of λ/4. The n-type contact layer is made of n-type Ga$_{0.5}$In$_{0.5}$P having a thickness of λ/4 in optical length doped with an n-type dopant at a concentration of $1 \times 10^{18}$ cm$^{-3}$.

Further, the λ resonator layer 306 has staked layers of an n-Al$_{0.3}$Ga$_{0.7}$AS layer (Si doping concentration $5 \times 10^{17}$ cm$^{-3}$) as a cladding layer, an active layer having a three-layer quantum well structure made of a GaAs/Al$_{0.2}$Ga$_{0.8}$As structure and a p-Al$_{0.3}$Ga$_{0.7}$As layer as a cladding layer (doping concentration $5 \times 10^{17}$ cm$^{-3}$). The total thickness of the λ resonator layer 306 is λ in optical length. The active layer is arranged to be in the center of the λ resonator layer 306. The upper DBR mirror 312 is formed by stacking two structures of p-AlAs/Al$_{0.2}$Ga$_{0.8}$As (thickness of each layer is λ/4 in optical length), a current confinement layer 208 and then 22.5 such structures. Here, the current confinement layer 308 has a thickness of 30 nm and has an insulating current confinement part of Al$_2$O$_3$ and a circular-disc-shaped current injection part of AlAs positioned in the center of the mesa post structure M3. The p-type contact layer 309 is made of p-type GaAs doped with a p-type dopant at a high concentration of $1 \times 10^{19}$ cm$^{-3}$. The p-side electrode 310 has a Ti/Au structure. The insulating layer 304 and the dielectric film 311 are both of SiO$_2$. The n-side electrode 315 is made of AuGe/Ni/Au. The p-side pad electrode 314, the n-side pad electrode 317 and the leads 313 and 316 all have structures of Cu/Au.

As is the case with the embodiment 2, this surface emitting laser element D31 outputs laser light L31 having a wavelength of 850 nm when voltage is applied to the p-side electrode 310 and the n-side electrode 315 via the p-side pad electrode 314 and the n-side pad electrode 317. Likewise, the surface emitting laser element D32 outputs laser light L32 having a wavelength of 850 nm by current injection.

Here, the substrate 301 is a substrate manufactured by the VGF method and doped with the n-type dopant at the concentration of $5 \times 10^{17}$ to $5 \times 10^{18}$ cm$^{-3}$ like in the embodiments 1 and 2. Its EPD is low, specifically, 500 cm$^{-2}$ or less, and as is the case with the embodiments 1 and 2, it becomes possible to prevent element deterioration and deviation from the design of the element characteristics.

Further, this surface emitting laser element D31 has the p-type current blocking layer 302 between the substrate 301 and the active layer of the λ resonator layer 306, and the adjacent surface emitting laser elements are separated from each other by the separation groove g. Hence, as is the case with the embodiments 1 and 2, electric isolation is also maintained.

Here, the surface emitting laser element array 300 shown in FIG. 5 is manufactured as follows: First, the buffer layer is formed on the substrate 301 by the MBE method. Then, the MOCVD method or the like is used to form the p-type current blocking layer 302 through the p-type contact layer 309 sequentially. Further, the p-side electrode 310 is formed. This is followed by protecting an inside opening of the p-side electrode 310 with a photo resist, performing wet etching with use of etchant having a mixture of sulfuric acid, hydrogen peroxide solution and purified water until the active layer side surface is exposed the upper surface of the n-type contact layer 305 is exposed thereby to form the mesa post M3. Here, the etchant used in the wet etching is for etching a compound semiconductor layer containing arsenic (As) as a main V-group element, here, AlxGal-xAs (0<=x<=1) and not etching a compound semiconductor containing phosphorus (P) as a main V-group element, here, Ga$_{0.5}$In$_{0.5}$P. Hence, the above-mentioned etching is selective etching and etching is stopped automatically on the upper surface of the n-type contact layer which is Ga$_{0.5}$In$_{0.5}$P layer. Here, the mesa post structure M3 to form may be formed by, instead of wet etching only, performing dry etching up to the vicinity of the active layer and performing wet etching first on the rest and then on part on the upper surface of the n-type contact layer 305. In this case, the verticality of the mesa post structure M3 is improved.

Then, the current confinement layer 308, the n-side electrode 315, the p-side pad electrode 314, the n-side pad electrode 317, the leads 313 and 316 and the separation groove g are formed thereby to complete the surface emitting laser element array 300.

Next, the above-mentioned manufacturing method is used to manufacture 100-channel surface emitting laser elements of the embodiment 3. Used as the substrate is an n-type GaAs substrate manufactured by the VGF method. Measured EPD of this GaAs substrate is 250 cm$^{-2}$. Besides, the mesa diameter of each surface emitting laser element is 30 μm and the element interval is 250 μm in both length and width.

The characteristics of each surface emitting laser element are measured with a result that electric resistance of each surface emitting laser element is 40Ω when a voltage of 2.8 V is applied. Besides, as the electric resistance between adjacent elements needs to be 4 kΩ or more, the electric resistance between the adjacent elements measured between the n-side electrodes is 100 MΩ or more which is enough to meet the requirement. Further, the adjacent elements are driven with separately convoluted modulation signals of 10 Gbps at a modulation speed of 10 Gbps and eye pattern of laser light output from one of the elements is measured. Measurement result shows the eye pattern is the same as that of the single driving case and no electric cross talk is recognized.

Embodiment 4

Next description is made about a surface emitting laser element array according to the embodiment 4 of the present invention. The surface emitting laser element array according to the embodiment 4 is made of a AlGaInAs/InP type semiconductor having a laser oscillation frequency of 1550 nm and 100 channels.

Figure 6:
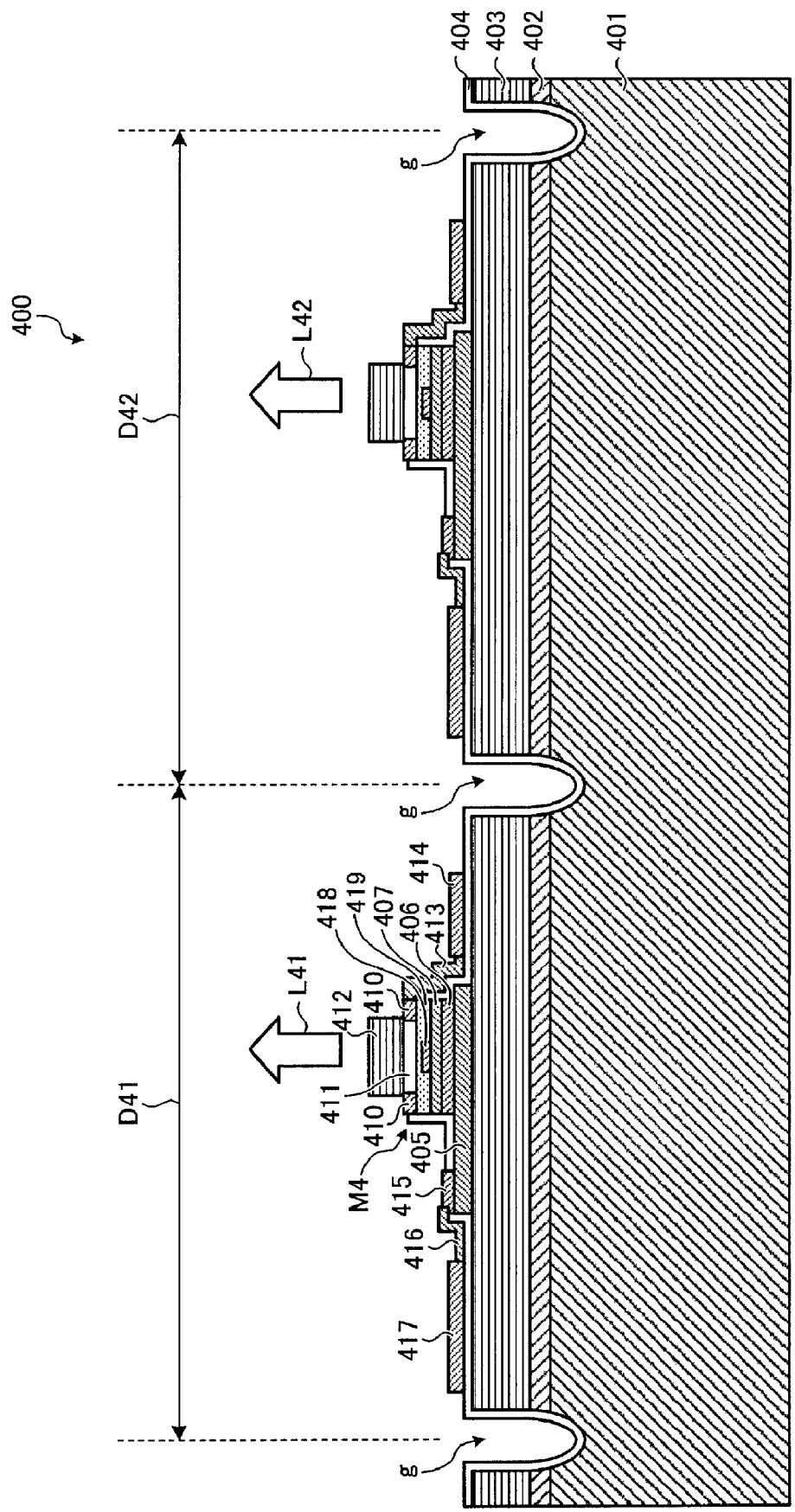
FIG. 6 is a cross sectional view schematically illustrating a surface emitting laser element array according to the embodiment 4.

FIG. 6 is a cross sectional view schematically showing a surface emitting laser element array 400 according to the embodiment 4. The surface emitting laser element array 400 has 100 surface emitting laser elements arranged on the substrate 401 in 10 width×10 length. FIG. 6 shows adjacent surface emitting laser elements D41 and D42 only. The following description is only made of the surface emitting laser element D41. The surface emitting laser element D41 has a p-type current broking layer 402, a lower DBR mirror 403, an n-type contact layer 405, an active layer 406, a p-type spacer layer 407, an embedded tunnel junction layer 418 and an n-type contact layer 419 stacked on the substrate 401 of n-type InP sequentially. Here, the active layer 406 through the n-type contact layer 419 are structured to have a column-shaped mesa post structure M4. Extending from the surface of the lower DBR mirror 403 to the substrate 401, a separation groove g is formed. Besides, on the n-type contact layer 419, a ring-shaped p-side electrode 410 is formed. On the surface except the surface of the p-side electrode 410, an insulating film 404 is formed and inside the ring of the p-side electrode 410, a dielectric film 411 is formed. Further, on the dielectric film 411, an upper DBR mirror 412 is formed. A p-side pad electrode 414 is formed on the insulating film 404 and is connected to the p-side electrode 410 via a lead 413 extending onto the insulating film 404. On the n-type contact layer 405, a semi-circular n-side electrode 415 is formed so as to cover the mesa post structure M4. Furthermore, an n-side pad electrode 417 is formed on the insulating film 404 and is connected to the n-side electrode 415 via a lead 416 extending onto the insulating layer 404.

The substrate 301 is made of an n-type InP doped with an n-type dopant such as sulfur (S) at a concentration of $5\times10^{17}$ to $5\times10^{18}$ cm$^{-3}$. On the surface thereof, there is formed as a buffer layer, an n-type InP layer doped with an n-type dopant at a concentration of $1\times10^{18}$ cm$^{-3}$. The p-type current blocking layer 402 is of p-type AlGaInAS of 200 nm thickness doped with a p-type dopant at a concentration of $1\times10^{18}$ cm$^{-3}$. The lower DBR mirror 403 has 50-pair stacked structures of non-doped AlGaInAs/InP. The reflective center wavelength of the lower DBR mirror 403 is 1550 nm. When the wavelength λ is 1550 nm, the thickness of each layer of the lower DBR mirror 403 is set to be an optical length of λ/4. The n-type contact layer 405 is made of n-type InP doped with an n-type dopant at a concentration of $1\times10^{18}$ cm$^{-3}$.

Further, the active layer 406 has a six-layer quantum well structure made of a $(Al_{0.25}Ga_{0.75})_{0.35}In_{0.65}As/(Al_{0.25}Ga_{0.75})_{0.55}In_{0.45}As$ GaAs/$Al_{0.2}Ga_{0.8}As$ structure and the p-type spacer layer 407 is a p-type InP layer doped with a p-type dopant such as Be at a concentration of $1\times10^{18}$ cm$^{-3}$. The embedded tunnel junction layer 418 is embedded in the n-type contact layer of n-type InP doped with an n-type dopant at a concentration of $1\times10^{18}$ cm$^{-3}$. This embedded tunnel junction layer 418 has a stacking structure of a $(Al_{0.15}Ga_{0.62})_{0.47}In_{0.53}As$ layer of p+-type doped with C at a high concentration of $1\times10^{20}$ cm$^{-3}$ and having layer thickness of 10 nm, a lower $(Al_{0.15}Ga_{0.85})_{0.47}In_{0.53}As$ layer of n+-type doped with Si at a high concentration of $2\times10^{19}$ cm$^{-3}$ and having layer thickness of 40 nm and an upper $(Al_{0.15}Ga_{0.85})_{0.47}In_{0.53}As$ layer of n-type doped with Si at a concentration of $2\times10^{18}$ cm$^{-3}$ and having layer thickness of 60 nm. The embedded tunnel junction layer 418 is positioned in the center of the mesa post structure M4 and a current injection part is formed by tunnel junction. The p-side electrode 410 has a Ti/Au structure. The insulating layer 404 and the dielectric film 411 are both of $SiO_2$. The upper DBR mirror 412 is a dielectric multilayer film reflective mirror and has a structure having 6-pair Si/$SiO_2$ (film thickness is λ/4 in optical thickness) when λ is 1550 nm. The n-side electrode 415 is made of AuGe/Ni/Au. The p-side pad electrode 414, the n-side pad electrode 417 and the leads 413 and 416 all have structures of Cu/Au.

When voltage is applied to the p-side electrode 410 and the n-side electrode 415 via the p-side pad electrode 414 and the n-side pad electrode 417 and current confined by the embedded tunnel junction layer 418 is injected to the active layer 406, the surface emitting laser element D41 outputs laser light L41 having a wavelength of 1550 nm. Likewise, the surface emitting laser element D42 outputs laser light L42 having a wavelength of 1550 nm by current injection.

Here, the substrate 401 is a substrate doped with the n-type dopant at the concentration of $5\times10^{17}$ to $5\times10^{18}$ cm$^{-3}$, its EPD is low, specifically, 500 cm$^{-2}$ or less, and therefore, it becomes possible to prevent element deterioration and deviation from the design of the element characteristics. This surface emitting laser element D41 has the p-type current blocking layer 402 between the substrate 401 and the active layer 406, and the adjacent surface emitting laser elements are separated from each other by the separation groove g. Hence, electric isolation can be also maintained.

Here, the surface emitting laser element array 400 shown in FIG. 6 is manufactured in almost the same way as the surface emitting laser element array 100. As to the method of forming the embedded tunnel junction layer 418, first, the like stacking structure of the embedded tunnel junction layer 418 is formed on the p-type spacer layer 407, then, the photolithography is used to form a round pattern having a diameter of 6 μm corresponding to the embedded tunnel junction layer 418, and selective etching is performed with a sulfate etchant thereby to form the embedded tunnel junction layer 418. Next, the chemical beam epitaxy or the MOCVD method is used to perform regrowth and the embedded tunnel junction layer 418 is embedded in the n-type contact layer 419 of n-type InP.

Next, the above-mentioned manufacturing method is used to manufacture 100-channel surface emitting laser elements of the embodiment 4. Used as the substrate is an n-type GaAs substrate manufactured by the VGF method. Measured EPD of this GaAs substrate is 250 cm$^{-2}$. Besides, the mesa diameter of each surface emitting laser element is 30 μm and the element interval is 250 μm in both length and width.

The characteristics of each surface emitting laser element are measured with a result that electric resistance of each surface emitting laser element is 70Ω when a voltage of 2.4 V is applied. Besides, as the electric resistance between adjacent elements needs to be 7 kΩ or more, the electric resistance between the adjacent elements measured between the n-side electrodes is 100 MΩ or more which is enough to meet the requirement. Further, the adjacent elements are driven with separately convoluted modulation signals of 10 Gbps and eye pattern of laser light output from one of the elements is measured. Measurement result shows the eye pattern is the same as that of the single driving case and no electric cross talk is recognized.

In the embodiments, the first conduction type is the n type and the second conduction type is the p type. However, the first conduction type may be the p type and the second conduction type may be the n type. The substrate is not limited to the n-type substrate and may be a p-type substrate, in which case the like effect of EPD reduction is achieved. When the p-type substrate is used, the p-type substrate may be a p-type InP substrate or p-type GaAs substrate doped with p dopant such as zinc (Zn) at a concentration of $5\times10^{17}$ to $5\times10^{18}$ cm$^{-3}$. In such a case, each semiconductor layer positioned on the substrate is of opposite conduction type.

In the above-mentioned embodiments, the current blocking layer is of the second conduction type, which is opposite to the substrate. However, in order to maintain the electric isolation, the current blocking layer may be of higher resistance irrespective of conduction type. In this case, the current blocking layer may be preferably a compound semiconductor layer containing arsenic as a main v-group element and doped with at least one of nitrogen, carbon, oxygen, boron and chromic oxide at a concentration of $1\times10^{16}$ cm$^{-3}$ or more so that the electric resistance between electrodes of adjacent surface emitting laser elements becomes at least 100 times larger than the electric resistance of each surface emitting laser element. In addition, the current blocking layer may be a compound semiconductor layer containing phosphorus as a main v-group element and doped with iron at a concentration of $1\times10^{16}$ cm$^{-3}$ or more thereby to obtain the like effect.

Further, for example, the stacking order of the n-type contact layer 105 to the p-type contact layer 109 may be reversed in the embodiment 1. If the stacking order is reversed, the p-type semiconductor layer area is positioned between the n-type substrate 101 and the active layer 106 and therefore, electric isolation between elements can be maintained without the p-type current blocking layer 102.

Furthermore, in the above-mentioned embodiments, the separation groove is used as an electric separation structure between surface emitting laser elements. However, the electric separation structure is not limited to the separation groove. If the substrate is an n-type substrate, the electric separation structure may be formed by implanting hydrogen into the substrate surface between elements so as to reach the substrate without forming the separation groove.

What is claimed is:

1. A surface emitting laser element array comprising:
   a substrate having a semiconductor of a first conduction type;
   a plurality of surface emitting laser elements each having, above the substrate, an active layer sandwiched between a first conduction type semiconductor layer area and a second conduction type semiconductor layer area and disposed between a upper reflective mirror and a lower reflective mirror, the surface emitting laser elements being separated from each other by an electric separation structure formed having such a depth as to reach the substrate;
   the first conduction type semiconductor layer area being arranged between the substrate and the active layer;
   a current blocking layer arranged between the substrate and the first conduction type semiconductor layer area; and
   two electrodes connected to the first conduction type semiconductor layer area and the second conduction type semiconductor layer area, respectively, and arranged on a side of the current blocking layer opposite to the substrate.

2. The surface emitting laser element array of claim 1, wherein the current blocking layer has a second conduction type.

3. The surface emitting laser element array of claim 2, wherein the current blocking layer has a layer thickness of 50 nm or more and a second conduction type carrier concentration is $5\times10^{17}$ cm$^{-3}$ or more.

4. The surface emitting laser element array of claim 1, wherein the current blocking layer is of high resistance.

5. The surface emitting laser element array of claim 4, wherein the current blocking layer is a compound semiconductor layer containing arsenic as a main v-group element and doped with at least one of nitrogen, carbon, oxygen, boron and chromic oxide at a concentration of $1\times10^{16}$ cm$^{-3}$ or more.

6. The surface emitting laser element array of claim 4, wherein the current blocking layer is a compound semiconductor layer containing phosphorus as a main v-group element and doped with iron at a concentration of $1\times10^{16}$ cm$^{-3}$ or more.

7. The surface emitting laser element array of claim 1, wherein an electric resistance between electrodes of adjacent surface emitting laser elements becomes at least 100 times larger than an electric resistance of each of the surface emitting laser elements.

8. The surface emitting laser element array of claim 2, wherein an electric resistance between electrodes of adjacent surface emitting laser elements becomes at least 100 times larger than an electric resistance of each of the surface emitting laser elements.

9. The surface emitting laser element array of claim 3, wherein an electric resistance between electrodes of adjacent surface emitting laser elements becomes at least 100 times larger than an electric resistance of each of the surface emitting laser elements.

10. The surface emitting laser element array of claim 4, wherein an electric resistance between electrodes of adjacent surface emitting laser elements becomes at least 100 times larger than an electric resistance of each of the surface emitting laser elements.

11. The surface emitting laser element array of claim 5, wherein an electric resistance between electrodes of adjacent surface emitting laser elements becomes at least 100 times larger than an electric resistance of each of the surface emitting laser elements.

12. The surface emitting laser element array of claim 6, wherein an electric resistance between electrodes of adjacent surface emitting laser elements becomes at least 100 times larger than an electric resistance of each of the surface emitting laser elements.

* * * * *